United States Patent
Carter et al.

(10) Patent No.: US 8,120,941 B2
(45) Date of Patent: Feb. 21, 2012

(54) BIDIRECTIONAL NON-VOLATILE MEMORY ARRAY ARCHITECTURE

(75) Inventors: Andrew John Carter, Minneapolis, MN (US); Yong Lu, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 352 days.

(21) Appl. No.: 12/502,001

(22) Filed: Jul. 13, 2009

(65) Prior Publication Data

US 2010/0118590 A1 May 13, 2010

Related U.S. Application Data

(60) Provisional application No. 61/112,272, filed on Nov. 7, 2008.

(51) Int. Cl.
*G11C 11/00* (2006.01)
(52) U.S. Cl. .......... 365/148; 365/100
(58) Field of Classification Search .......... 365/148, 365/100, 63
See application file for complete search history.

(56) References Cited

U.S. PATENT DOCUMENTS

| | | | |
|---|---|---|---|
| 5,926,417 A * | 7/1999 | Chang | 365/185.26 |
| 6,569,745 B2 | 5/2003 | Hsu | |
| 6,584,016 B2 | 6/2003 | Park | |
| 6,711,051 B1 | 3/2004 | Poplevine et al. | |
| 6,711,067 B1 | 3/2004 | Kablanian | |
| 6,741,492 B2 | 5/2004 | Nii | |
| 6,781,867 B2 | 8/2004 | Kurth et al. | |
| 7,088,624 B2 | 8/2006 | Daniel et al. | |
| 7,092,279 B1 | 8/2006 | Sheppard | |
| 7,324,366 B2 * | 1/2008 | Bednorz et al. | 365/148 |
| 7,542,326 B2 * | 6/2009 | Yoshimura et al. | 365/148 |
| 2006/0233017 A1 | 10/2006 | Hosotani et al. | |
| 2007/0076464 A1 * | 4/2007 | Koebernick et al. | 365/100 |
| 2007/0147102 A1 * | 6/2007 | Roehr | 365/100 |

* cited by examiner

*Primary Examiner* — Vu Le
(74) *Attorney, Agent, or Firm* — Fellers Snider, et al.

(57) ABSTRACT

A bidirectional memory array architecture for non-volatile memory is disclosed. In accordance with some embodiments, a plurality of memory cells are arranged into an M number of rows and an N number of columns with each memory cell having a resistive sense element (RSE) and a switching device. A total number of M+N+1 control lines extend adjacent to and are connected with the memory cells to facilitate bi-directional programming of resistive states to each memory cell.

20 Claims, 8 Drawing Sheets

BIDIRECTIONAL NON-VOLATILE MEMORY ARRAY ARCHITECTURE

RELATED APPLICATIONS

This application makes a claim of domestic priority under 35 U.S.C. §119(e) to U.S. Provisional Patent Application No. 61/112,272 filed Nov. 7, 2008.

BACKGROUND

Electronic data storage devices generally operate to store and retrieve data in a fast and efficient manner. Some devices utilize numerous components in a complex process to facilitate the various functions of the device, such as the reading or writing of data to a storage medium. Access to a specific memory cell in a storage medium can often require large amounts of processing time and power due to complex circuitry used to provide access.

As will be appreciated, the capacity and productivity of the data storage device may be hindered when scaled to a small order of magnitude and a high error rate results. The use of a large number of control lines and line drivers can often require distinct separation that is not available when data storage devices are scaled down. Furthermore, large currents used to read and write bi-directional memory cells can easily provide errors when such distinct separation is not precisely monitored and regulated during manufacturing. Such errors can easily affect the functionality of data storage devices so that considerable loss in efficiency and capacity is noticeable.

In these and other types of electronic data storage devices, it is often desirable to increase productivity and capacity, particularly with regard to the complexity of the circuitry that provides access to the various memory cells in the data storage device.

SUMMARY

Various embodiments of the present invention are generally directed to a bi-directional memory array architecture for non-volatile memory.

In accordance with some embodiments, a plurality of memory cells are arranged into an M number of rows and an N number of columns with each memory cell having a resistive sense element (RSE) and a switching device. A total number of M+N+1 control lines extend adjacent to and are connected with the memory cells to facilitate bi-directional programming of resistive states to each memory cell.

These and other features and advantages which characterize the various embodiments of the present invention can be understood in view of the following detailed discussion and the accompanying drawings.

DETAILED DESCRIPTION

The present disclosure generally relates to the reading and writing of data to a memory space, and in particular to methods and architecture that may be used to improve the efficiency of accessing selected portions of memory. Prior art memory arrays often utilize complex circuitry that requires burdensome processing time and large amounts physical space. Moreover, some existing memory arrays cannot be reliably constructed and operated in the ever shrinking semiconductor scale regime.

Accordingly, a bi-directional memory array and methodology is disclosed herein that provides a plurality of memory cells that are arranged into an M number of rows and an N number of columns in with each memory cell consists of at least a resistive sense element (RSE) and a switching device. The various embodiments of the present invention allow a total number of M+N+1 control lines that extend adjacent to and are connected with the memory cells to facilitate bi-directional programming of resistive states to each memory cell. As such, the complexity and reliability of bi-directional programming of non-volatile memory cells can be improved while providing a scalable memory array for practical construction.

Figure 1:
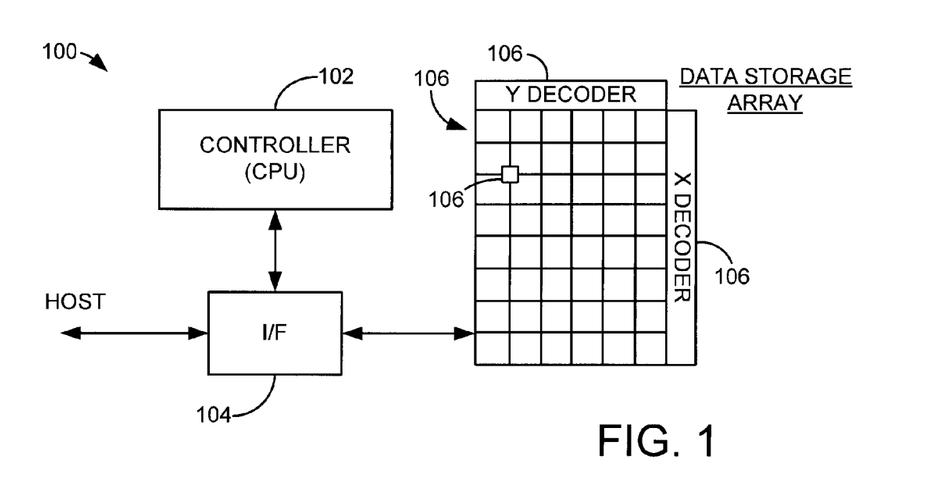
FIG. 1 is a general representation of an exemplary circuitry used to read and write data to a memory device as constructed and operated in accordance with various embodiments of the present invention.

In general, FIG. 1 provides a functional block representation of a data storage device 100 constructed and operated in accordance with various embodiments of the present invention. The device 100 includes a top level controller 102, an interface (I/F) circuit 104 and a data storage array 106. The I/F circuit 104 operates under the direction of the controller 102 to transfer user data between the array 106 and a host device (not shown).

In some embodiments, the device is characterized as a solid-state drive (SSD), the controller 102 is a programmable microcontroller, and the array 106 comprises an array of nonvolatile memory cells 108. In other embodiments, the data storage array 106 can have separate X and Y decoders 110 and 112, respectively, to provide access to selected memory cells 108. However, the configuration and operation of the various components of the data storage device 100 are not required or limited and can be modified, as desired.

Figure 2:
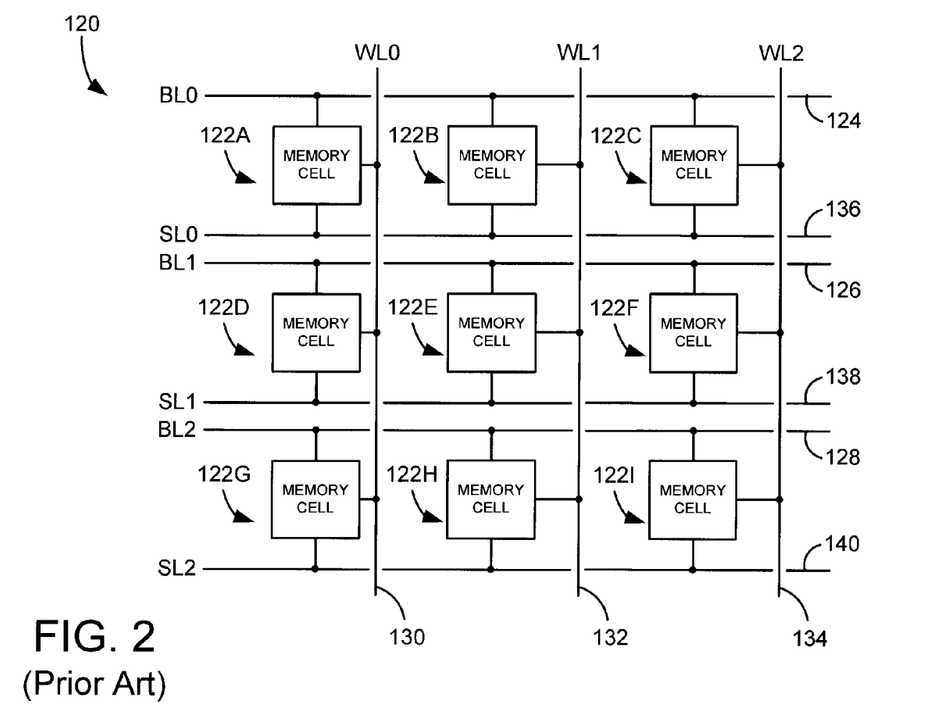
FIG. 2 displays an exemplary prior art data storage array.

FIG. 2 shows a prior art data storage array 120 that uses a number of memory cells, denoted as 122A-122I. A plurality of control lines are provided to access the cells, including first, second, and third bit lines BL0 124, BL1 126, and BL2 128, first, second, and third word lines WL0 130, WL1 132, and WL2 134, and first, second, and third source lines SL0 136, SL1 138, and SL2 140. Each memory cell 122 is connected to a bit line and source line to allow multiple resistive states to be programmed to a selected memory cell that is activated by a corresponding word line.

In an exemplary operation, the programming of a selected memory cell (i.e. 122E) would involve driving a high voltage through the second bit line 126 while connecting the second source line 138 to a low voltage while activating the corresponding second word line 132. A read or write current could only then flow through the bit line (BL1), through the memory element 122E and to the source line 138.

While theoretically functional, certain disadvantages are created when the data storage array 120 is scaled to a practical dimension. For example, the large number of control lines (i.e. 9 control lines to control 9 memory cells) each requires an isolated physical space in a semiconductor data storage device, such as the device 100 of FIG. 1. Such physical space requirements can inhibit the scalability of a memory array and consequently the capacity of a data storage device. Moreover, scaling the large number of control lines shown in FIG. 2 can exhibit high error rates due in part to strict manufacturing tolerances and relatively large programming currents needed to set some bi-directional memory cells.

Hence, by decreasing the overall number of control lines in a bi-directional memory array, reliability and scalability can be improved. Meanwhile, a reduced number of control line drivers can lower the processing overhead as well as power consumption that often plays a detrimental role in memory architectures such as the array 120 shown in FIG. 2.

Figure 3:
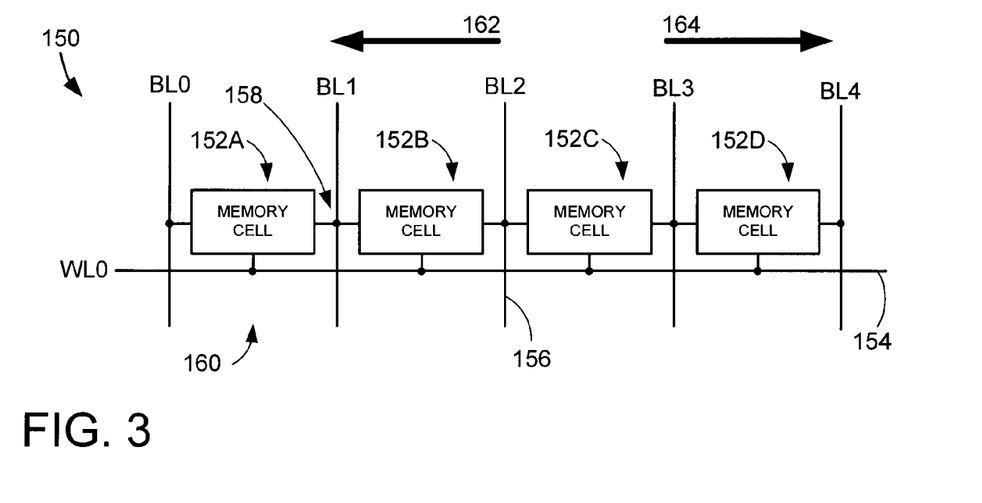
FIG. 3 shows an exemplary row of memory cells constructed and operated in accordance with various embodiments of the present invention.

FIG. 3 displays a row of memory cells 150 constructed in accordance with various embodiments of the present invention. A number of memory cells, denoted 152A-152D, are connected to a common word line WL0 154 and between bit lines 156. As shown, each memory cell shares a connection node 158 with at least one other memory cell 152. As a result, the row of memory cells 150 effectively eliminates the source lines shown in FIG. 2 and reduces the overall number of control lines needed to provide bidirectional current to each memory cell 152, as desired.

With the row of memory cells 150 sharing a bit line 156 between each memory column 160, fewer number of programming processes are needed to provide bi-directional current to multiple selected memory cells 152. For example, programming of selected memory cells 152C and 152D can be achieved by driving a high voltage through bit lines BL0, BL1, and BL2, connecting bit line BL4 to a low voltage, toggling bit line BL3 from low voltage to a high voltage, and activating the word line 154. Hence, the bit lines to one side 162 of a selected memory cell are connected to a first voltage while bit lines to the opposing side 164 are connected to a second voltage.

As such, a plurality of memory cells 152 can be programmed with minimal processing time and complexity as the toggling of a single bit line from low voltage to high voltage allows the additional memory cell 152D to be written. In contrast, the prior art memory array shown in FIG. 2 would require the activation of multiple control lines with different voltages to enable the programming of a second selected memory cell along a row. Moreover, the row of memory cells 150 allows for time efficient access to one or more memory cells without having to further activate different sets of control lines (i.e. BL1 and SL1).

Figure 4:
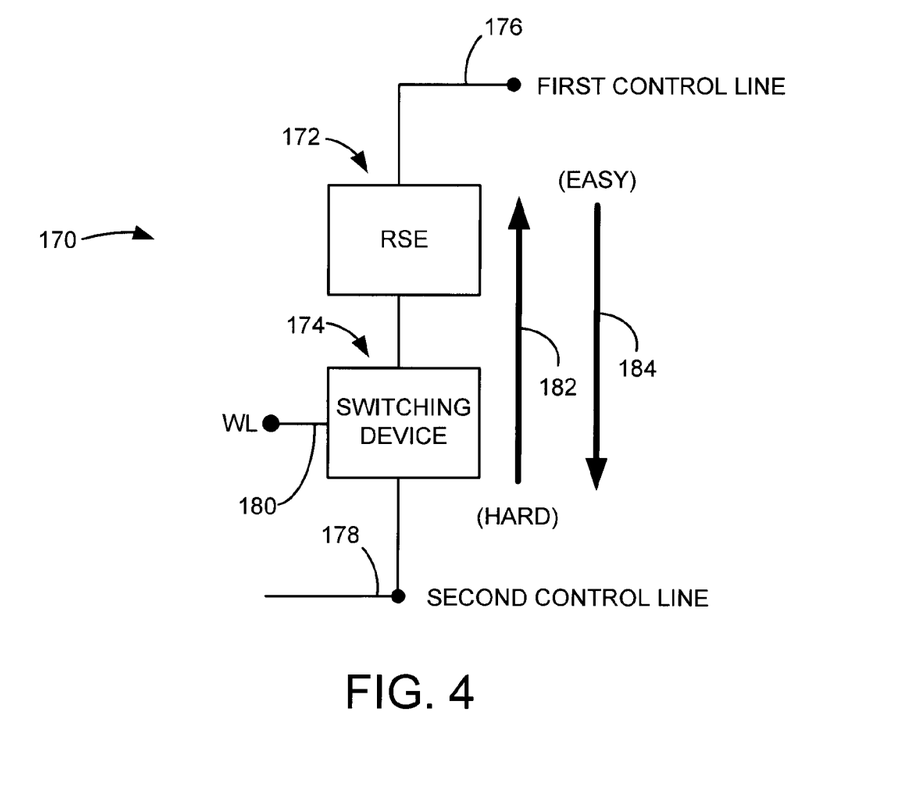
FIG. 4 generally illustrates functional block diagram illustrating operation of various embodiments of the present invention.

FIG. 4 shows an exemplary operation of a memory cell 170, such as the memory cell 152 of FIG. 3. The memory cell 170 can be constructed with a resistive sense element (RSE) 172 and a switching device 174 coupled in series between a first control line 176 and a second control line 178. A word line 180 can further be connected to the switching device 174 to enable select activation of the memory cell 170. However, the orientations of the various components of the memory cell 170 are not limited as the locations of the RSE 172 and switching device 174 can be modified in relation to the first and second control lines 176 and 178.

As bidirectional RSEs 172 are utilized, the memory cells 170 can exhibit dichotomous write characteristics, in that a greater driver effort can be required to switch to some programmed states as compared to other programmed states. For example, FIG. 4 identifies a hard programming direction for the RSE 172 by arrow 182, and an easy programming direction for the RSE by arrow 184. The hard direction 182 corresponds to the direction of current flow (from the second control line 178 to the first control line 176) to switch the RSE 172 from a first resistive state to a second resistive state. In contrast, the easy direction 184 flows current the opposite direction (from the first control line 176 to the second control line 178) to switch the RSE 172 from the second resistive state to the first resistive state.

As an example, the hard direction could correspond to the programming of the RSE 172 from a parallel magnetic orientation to an anti-parallel orientation. Conversely, the easy direction can correspond to programming a parallel magnetic orientation from an anti-parallel orientation. The relative ordering of the RSE 172 and the switching device 174 within a memory cell can also contribute to write characteristics. For example, in the hard programming direction 182, the write current can traverse the switching device 174 prior to reaching the RSE 172. The voltage presented to the RSE 172 is thus substantially the voltage of the word line 180 minus the voltage drop through the switching device. By contrast, in the easy programming direction 184 a write current passes through the RSE 172 prior to the switching device 174, and the voltage presented to the RSE 172 will be substantially the voltage of the first control line 176.

As such, various embodiments of the present invention are generally directed to compensating for write characteristics of a memory cell 170. In some embodiments, when programming in an easy programming direction, the word line 180 applies a standard voltage to the switching device 174. However, when programming in the hard direction, the word line 18 can respond by applying an elevated voltage to the switching device 174 Such adjustment in voltage can compensate for write asymmetries of the memory cell 170 by facilitating a higher source voltage at the RSE 172.

Although various embodiments set forth above generally identify the hard and easy directions based on the relative sequential ordering of the RSE 172 and switching device 174 of a cell, such is not necessarily limiting. Rather, it is contemplated that various memory cell constructions may alternatively have an "easy" and a "hard" direction based on some other feature of the cell. It will be understood that the various embodiments disclosed herein are equally suitable for these other types of memory cells. Moreover, it will be appreciated that in situations where multiple states are written, there can still be a hard programming direction to write some states, and an easy programming direction to write other states.

Figure 5:
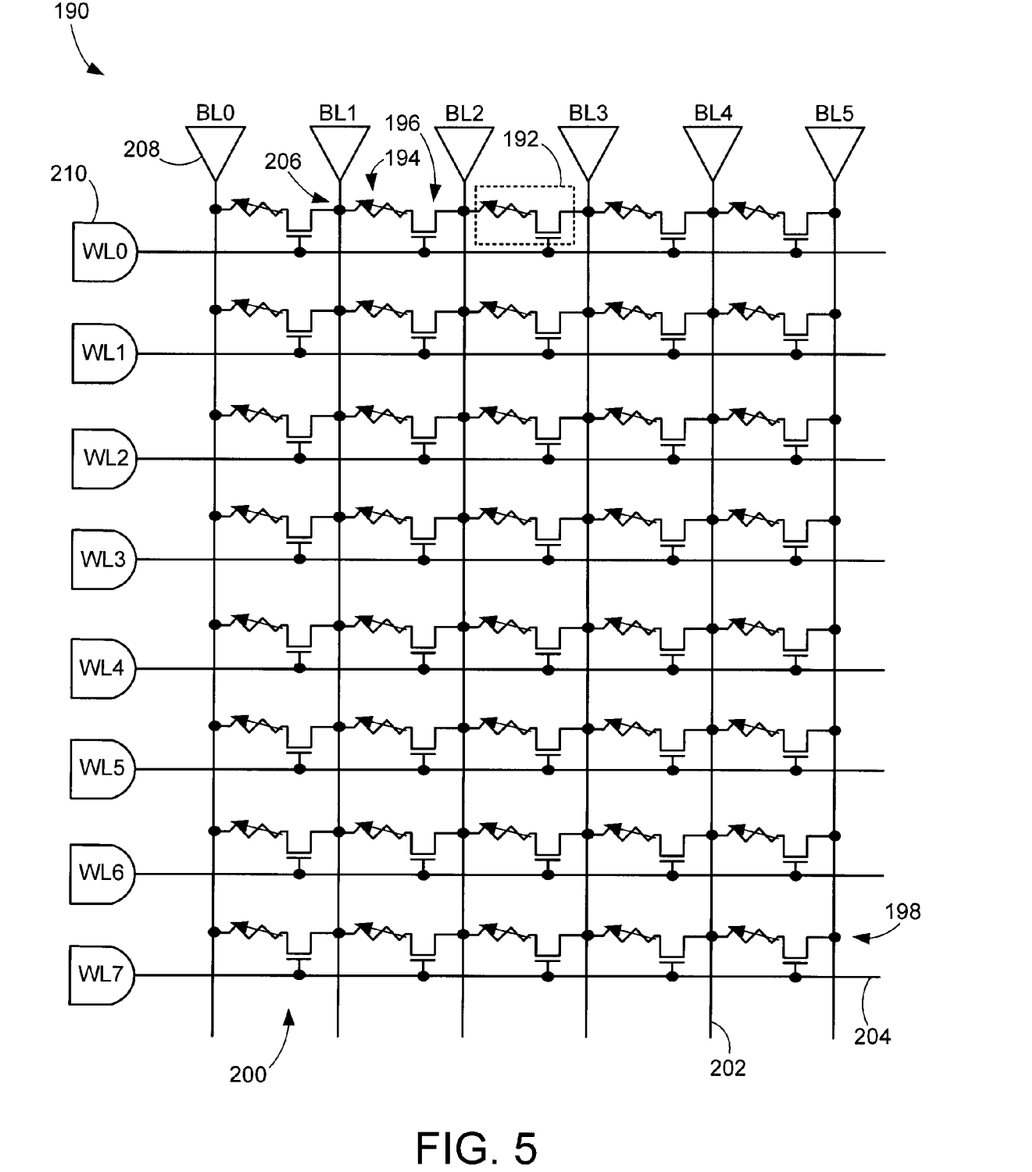
FIG. 5 displays an exemplary bi-directional memory array constructed and operated in accordance with various embodiments of the present invention.

FIG. 5 generally illustrates a bi-directional memory array 190 constructed in accordance with various embodiments of the present invention. A plurality of memory cells 192 can each be constructed with an RSE 194 and a switching device 196 coupled in series, as shown in FIG. 4. The memory cells 192 can also be arranged in rows 198 and columns 200 to which first and second control lines 202 and 204 extend adjacent to and connect with the various portions of each memory cell 192.

As shown, each first control line 202 extends adjacent to each column of memory cells 200 while each second control line 204 extends adjacent to each row of memory cells 198 and has an orthogonal relation to the first control line 202. A connection node 206 is further included in the bi-directional memory array 190 at the intersection of each first control line 202 and each row 198. In some embodiments, the connection node 206 represents the connection of adjacent memory cells 192 along each row 198. While in other embodiments, the connection node 206 is coupled directly to the first control line 202, a drain region of a switching device 196 of a first memory cell on a first side and an RSE 194 of an adjacent second memory cell on a second side.

However, such orientation is not required or limited as it is contemplated that the connection node 206 can be directly connected to a drain region of a switching device 196 of a first memory cell 192 and a source region of a switching device of an adjacent second memory cell 192. It should be noted that the various control lines 202 and 204 can be controlled by common drivers or by individual first and second drivers 208 and 210, respectively. It can be appreciated that the various first and second drivers 208 and 210 are not limited to the types of drivers or orientation shown in FIG. 5, and can be constructed in any configuration, as desired.

Figure 6A:
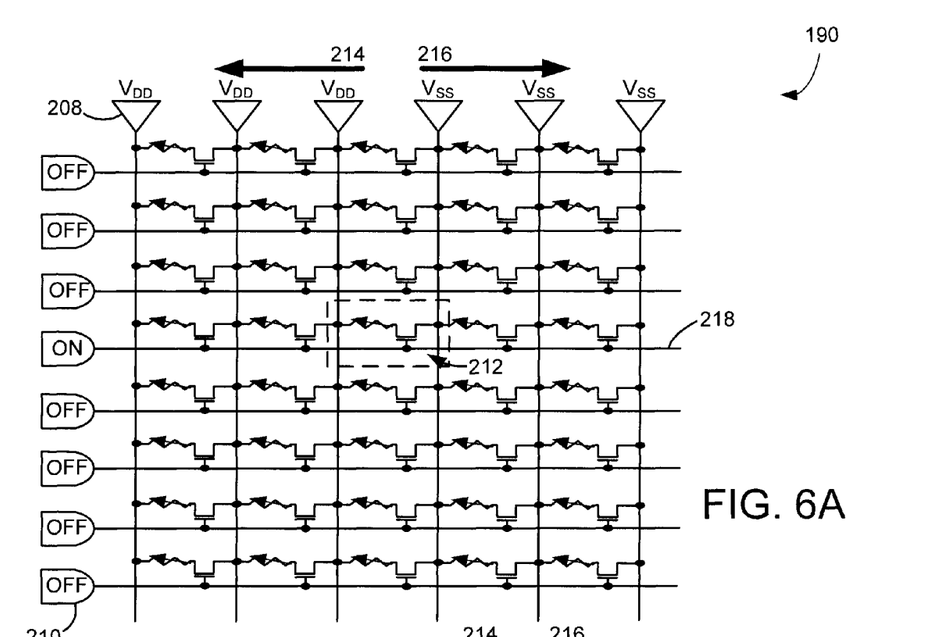
FIGS. 6A-6B provide exemplary operations of the bi-directional memory array of FIG. 5.
Figure 6B:
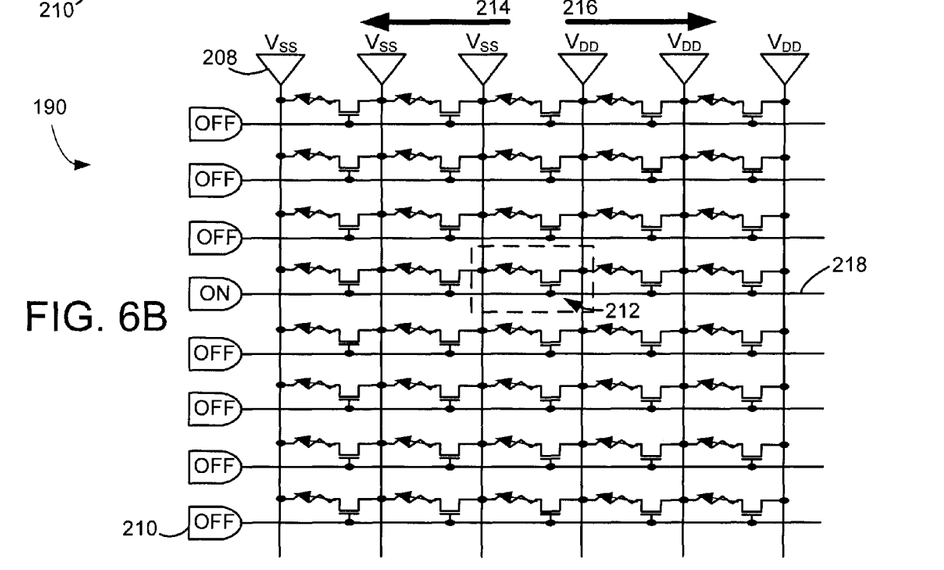

FIGS. 6A-6B depict various exemplary operations conducted on the bi-directional memory array 190 of FIG. 5 in accordance with various embodiments of the present invention. Specifically regarding FIG. 6A, a selected memory cell 212 is designated to be programmed to first resistive state that requires a positive current traveling through the RSE 194. The first control line drivers 208 coupled to the first control lines 202 to the right side 214 of the selected memory cell 212 and corresponding column 200 are all connected to a first voltage ($V_{SS}$). Meanwhile, the first control line drivers 208 connected to the first control lines 202 to the left side 216 of the selected memory cell 212 are connected to a second voltage ($V_{DD}$). In some embodiments, the first voltage corresponds to a low voltage, such as a ground, while the second voltage corresponds to a high voltage, such as a predetermined write voltage.

In contrast, FIG. 6B illustrates an operation in which a second resistive state can be programmed to the selected memory cell 212. While the second resistive state can be programmed by passing a write current through the memory cell in a direction opposite of the direction used to program the first resistive state, such operations are not limited or required. However, in some bi-directional memory cells, a negative current passing through the selected memory cell 212 in a direction opposite from the direction used to program the first resistive state is necessary. In such a necessary situation, the first control line drivers 208 coupled to the first control lines 202 to the right side 214 of the selected memory cells are connected to the second voltage ($V_{DD}$) while the remaining first line drivers 208 are connected to the first voltage ($V_{SS}$).

It can be appreciated that the operations depicted in either FIGS. 6A or 6B cannot be facilitated, as shown, without the activation of the second control line 218 corresponding to the selected memory cell 212 with a second control line driver 210. As discussed above, depending on the type of bi-directional RSE and memory cell configuration, a hard write direction can be experienced. In response, the second control line driver 210 can apply an elevated voltage to compensate for the asymmetrical write characteristics.

It can further be appreciated that the present invention is not limited to the programming of individual memory cells and can be easily adapted to concurrently or successively write, or read, data to or from the memory cells across the memory array 190. That is, programmed resistive states can be read from or written to numerous different memory cells corresponding to different rows 198 and columns 200 by toggling various first and second control lines 202 and 204. As a result, data can be inputted or outputted from the bi-directional memory array 190 quickly and efficiently due to the small number of processing changes (i.e. toggle one control line to output/input data from a different memory cell).

Figure 7A:
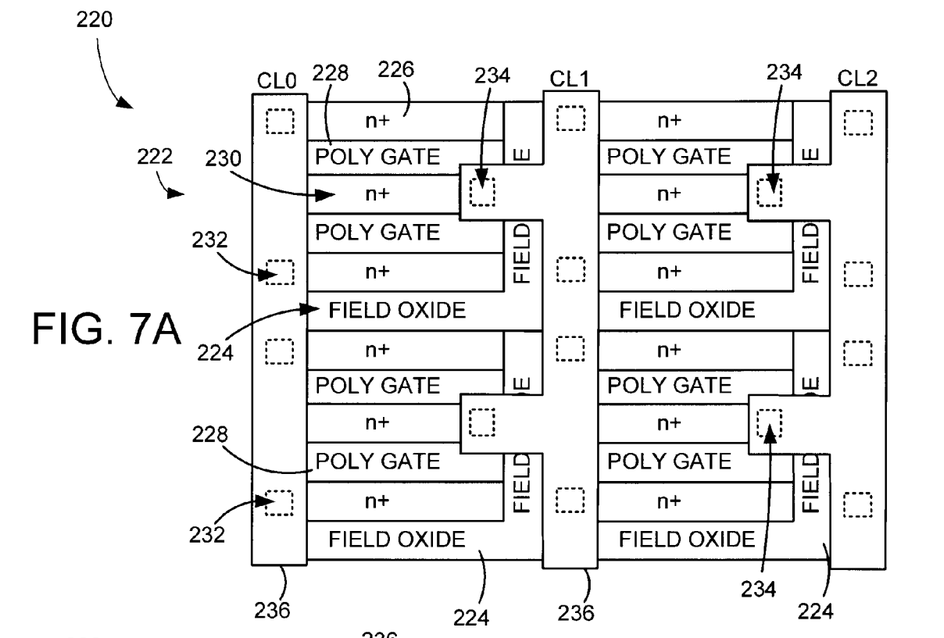
FIGS. 7A-7B show an exemplary construction of a bi-directional memory array in accordance with various embodiments of the present invention.
Figure 7B:
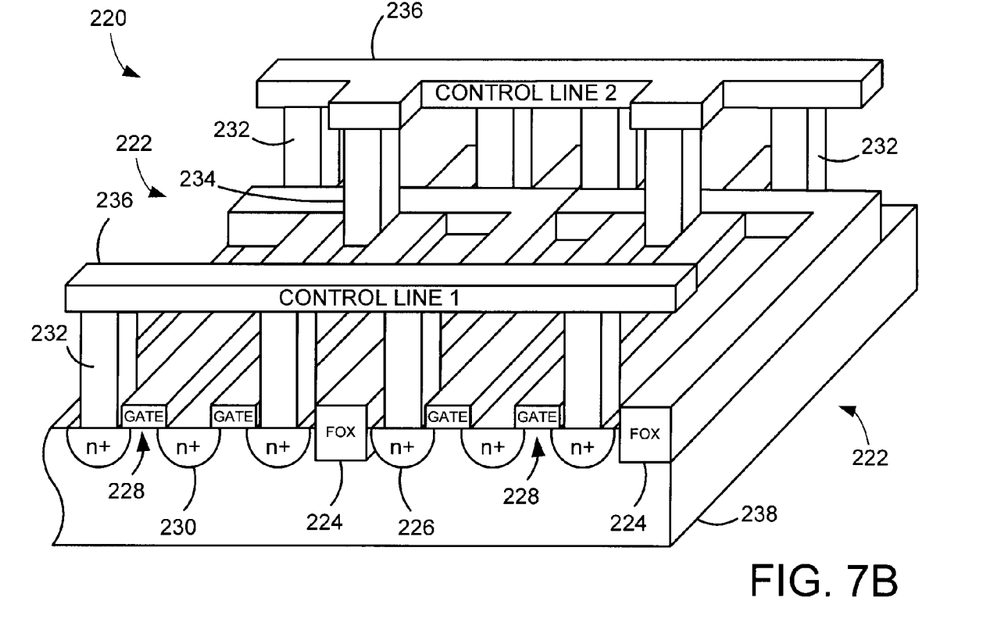

In FIGS. 7A-7B, an exemplary construction of a bi-directional memory array 220 is displayed in accordance with various embodiments of the present invention. When formatted to a practical layout, the bi-directional memory array 220 can be constructed with a plurality of memory cell 222 separated by a field oxide material 224. As shown, each memory cell 222 can have a plurality of doped regions 226 adjacent to one or more poly gates 228 that functions as a switching device, such as the switching device 196 of FIGS. 5 and 6. Furthermore, each memory cell 222 can be configured so that a source doped region 230 is connected to a plurality of memory regions 222 along a row, such as the row 198 of FIG. 5.

In addition, each memory cell 222 can have a plurality of active contacts 232 and an RSE 234 connected to the doped regions 226 so that a current can pass only when the poly gates 228 are activated. That is, upon activation of the poly gates 228 for any memory cell 222, current can pass from through the doped regions 226, RSE 234, active contacts 232, and control line 236.

In an isometric view of the bi-directional memory array 220, shows the orientation of the various components with respect to a substrate 238. While the substrate 238 can be constructed of any number of materials, the plurality of doped regions 226 are n+ doped, in some embodiments, and connected by the poly gates 228. Further, each memory cell 222 present on the substrate 238 is separated on multiple sides by a field oxide 224 that prevents inadvertent intermingling of signals between memory cells 222.

In operation, a signal can traverse through a selected memory cell 222 on the substrate 238 in multiple different directions with the manipulation of the control lines 236 as well as the source doped region 230. For example, a read or write current could initiate in the first control line and proceed through the active contacts 232, doped regions 226, and the poly gates 228 with the activation of the source doped region 230. Subsequently, the source doped region 230 can transport the read or write current to the RSE 234 in which the desired operations (i.e. reading or programming a resistive state) are conducted and the residual current is conducted through the second control line.

It can be appreciated that to facilitate such an operation, a first line driver (not shown), such as the driver 208 of FIG. 5, would apply a high voltage to the first control line while a second driver (not shown) would couple the second control line to a low voltage. Conversely, current could traverse through the memory cell 222 and RSE 234 in a reverse manner by initiating at the second control line that is connected to a line driver applying a high voltage while a low voltage is connected to the first control line. However, it should be noted that the switching device composed of the doped regions 226, poly gates 228, and source doped region 230 would effectively prevent the application of current to the RSE 234 in either direction if the source doped region 230 is not activated.

It should further be noted that the configuration and orientations of the various components of the bi-directional memory array 220 are not required or limited and can be modified as needed. Specifically, the size and shape of the RSE 234 and control lines 236 can be adjusted to accommodate various types of bi-directional memory.

Figure 8:
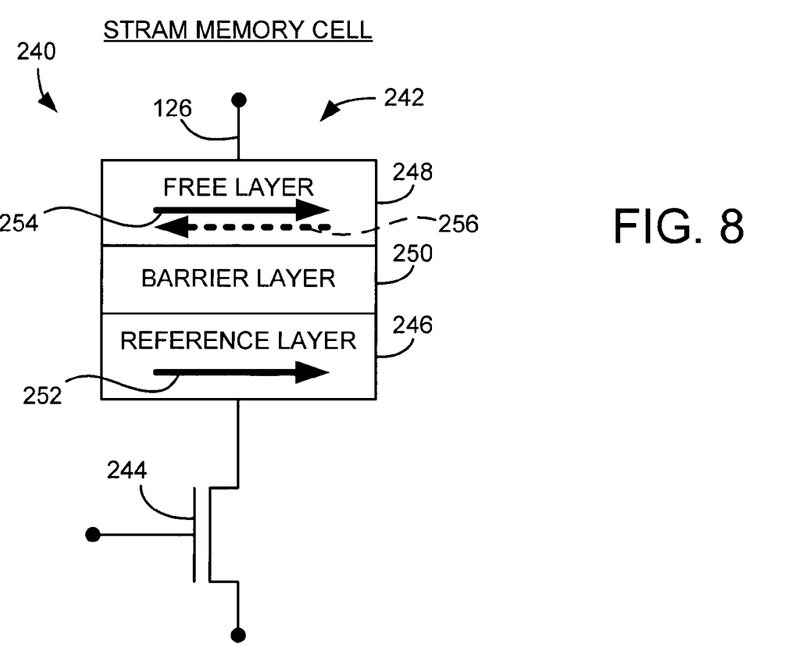
FIG. 8 generally illustrates an exemplary spin torque transfer random access memory (STRAM) cell.

FIG. 8 generally illustrates an exemplary construction of a bidirectional memory cell 240. The memory cell 240 includes a resistive sense element (RSE) 242 coupled to a switching device 244. The cell 240 has a spin-torque transfer random access memory (STRAM) configuration so that the RSE 242 is characterized as a magnetic tunneling junction (MTJ), although other cell configurations can be used. Also, while the switching device 244 is contemplated as comprising an n-channel metal oxide semiconductor field effect transistor (NMOSFET), other configurations of field effect transistors can be used individually or in combination with any NMOSFETs.

The RSE 242 includes a fixed reference layer 246 and a programmable free layer 248 (recording layer) separated by an intervening tunneling (barrier) layer 250. The reference layer 246 has a fixed magnetic orientation in a selected direction, as indicated by arrow 252. This fixed magnetic orientation can be established in a number of ways, such as via pinning to a separate magnet (not shown).

The free layer 248 has a selectively programmable magnetic orientation that can be parallel (solid arrow 254) or anti-parallel (dotted arrow 256) with the selected direction of the reference layer 246. However, the magnetizations of the memory cell 240 is not limited or required as other respective magnetization orientations can be used, as desired.

A low resistance state for the RSE 242 is achieved when the magnetization of the free layer 248 is oriented to be substantially in the same direction (parallel) as the magnetization of the reference layer 246. To orient the RSE 242 in the parallel low resistance state, a write current passes through the RSE 242 so that the magnetization direction of the reference layer 246 sets the magnetic orientation of the free layer 248. Since electrons flow in the direction opposite to the direction of current, the write current direction passes from the free layer 248 to the reference layer 246, and the electrons travel from the reference layer 246 to the free layer 248.

A high resistance state for the RSE 242 is established in the anti-parallel orientation in which the magnetization direction of the free layer 248 is substantially opposite that of the reference layer 246. To orient the RSE 242 in the anti-parallel resistance state, a write current passes through the RSE 242 from the reference layer 246 to the free layer 248 so that spin-polarized electrons flow into the free layer 248 in the opposite direction.

In some embodiments, a low resistance, parallel state is used to represent a logical 0, and the high resistance, anti-parallel state is used to represent a logical 1. Additional programmed states can be used when the RSE is configured to store multiple bits. For example, programmed resistances R1<R2<R3<R4 can be used to respectively store multi-bit values "00," "01," "10" and "11".

Figure 9A:
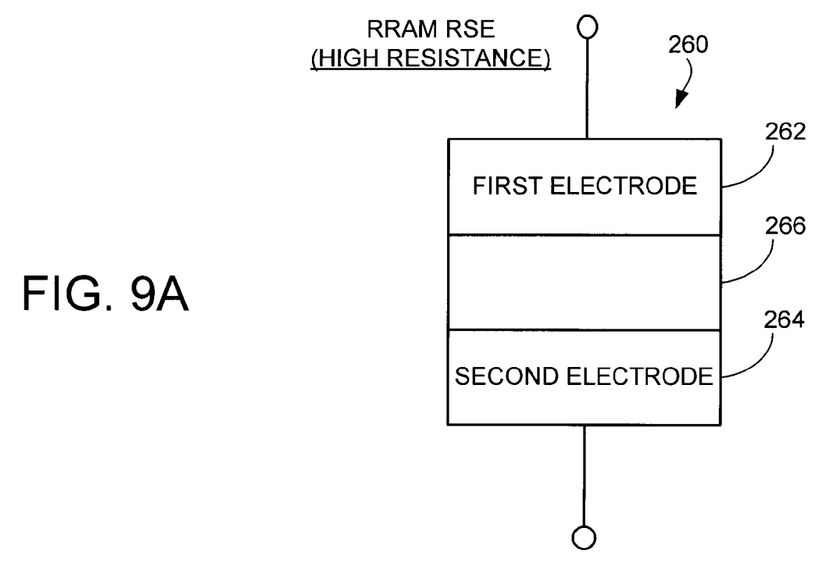
FIGS. 9A-9B display an exemplary resistive random access memory (RRAM) cell.
Figure 9B:
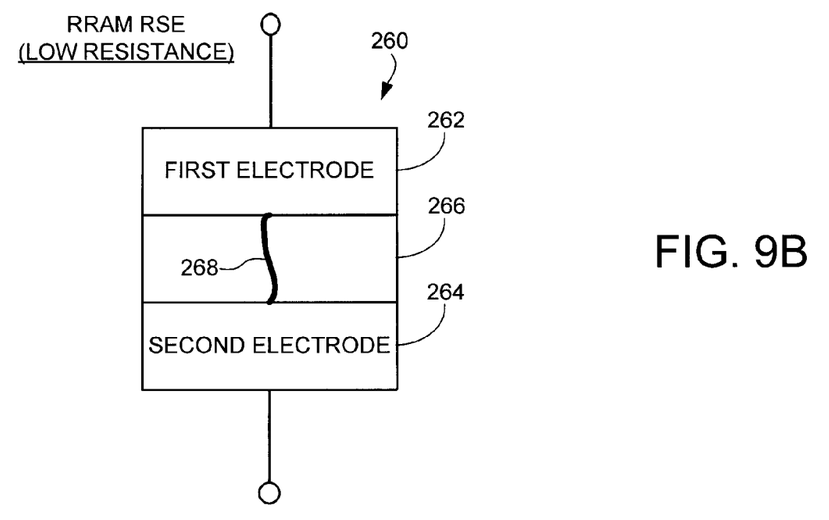

FIGS. 9A-9B show an exemplary RSE construction 260 characterized as resistive random access memory (RRAM). Opposing metal or metal alloy electrode layers 262, 264 are separated by an intervening oxide layer 266. A first, higher resistance programmed state is denoted by FIG. 9A, and a second, lower resistance programmed state is denoted by FIG. 9B.

In FIG. 9A, the relatively higher resistance state is established by the nominal electrical resistance of the oxide layer 266. Application of a suitable write voltage potential and/or write current in a selected direction across the RSE 260 will induce metal migration from the electrode layer 262, forming one or more electrically conductive metallization filaments 268 through the oxide layer as shown in FIG. 9B. Such filaments generally operate to lower the characteristic resistance of the cell. To return the programmed state of the RSE 260 to the high resistance state of FIG. 9A, an appropriate write voltage potential and/or current is applied through the RSE 260 in the opposite direction.

RRAM RSEs such as 260 can exhibit asymmetric write characteristics in that it can be generally more difficult to program the RSE 260 in a first direction as compared to a second direction. For example, the hard direction for programming the RSE 260 may be to the high resistance state of FIG. 9A, and the easy direction for programming the RSE 260 may be to the low resistance state of FIG. 9B.

Figure 10A:
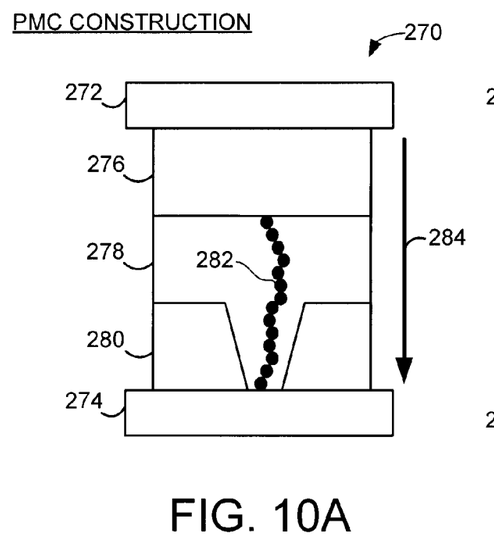
FIGS. 10A-10B show an exemplary programmable metallization cell (PMC) construction of the memory cell.
Figure 10B:
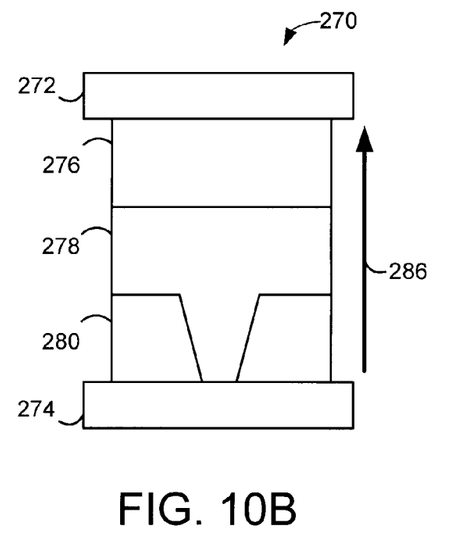

FIGS. 10A-10B illustrate an exemplary programmable metallization cell (PMC) element 270 suitable for use as a bipolar resistive sense element. The PMC element 270 includes top and bottom electrodes 272, 274, a metal layer 276, an electrolyte layer 278 and a dielectric layer 280. Control circuitry (not shown) can be used to adjust the relative voltage potential between the first and second electrodes 272, 274, resulting in passage of a write current 282 through the PMC element 270 to form a filament 284.

The filament 284 establishes an electrically conductive path between the metal layer 276 and the bottom electrode 274 by the migration of ions from the metal layer 276 and electrons from the bottom electrode 274. The dielectric layer 280 focuses a small area of electron migration from the bottom electrode 274 in order to control the position of the resulting filament 284. The filament reduces the effective resistance of the PMC element 270 to a relatively low resistance, which can be assigned a selected logical value such as logical 1.

Subsequent application of a write current 286 in a second direction through the PMC element causes migration of the ions and electrons back to the respective electrodes 272, 274, as shown in FIG. 10B. This resets the PMC element 270 to its initial high electrical resistance, which can be assigned a different logical value such as logical 0. PMC elements with a construction similar to that shown at 270 can alternatively be programmed using unipolar programming currents of different magnitudes and/or pulse widths.

Figure 11:
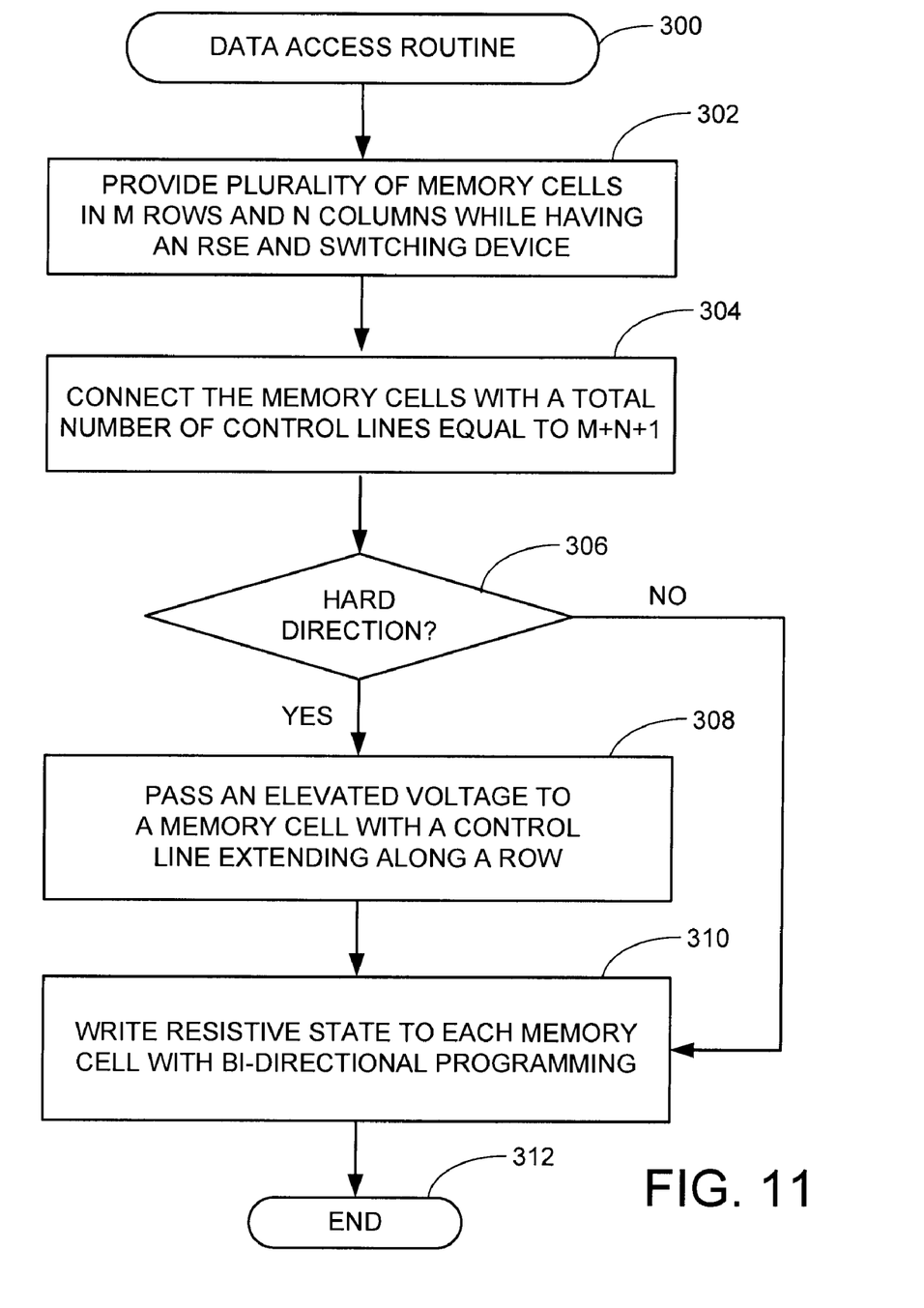
FIG. 11 provides a flowchart of an exemplary DATA ACCESS ROUTINE carried out in accordance with various embodiments of the present invention.

FIG. 11 provides a flow chart for a data access routine 300, generally illustrative of steps carried out in accordance with various embodiments of the present invention. Initially, step 302 provides a plurality of memory cells that are arranged in an M number of rows and an N number of columns and each have a resistive sense element coupled in series with a switching device. The memory cells are connected, in step 304, to a total number of M+N+1 control lines that extend adjacent to the memory cells along each row and column.

In various embodiments, each control line extending along the columns has a connection node that represents the intersection of a control line and two adjacent memory cells. In addition, the connection node can be configured as the intersection of a drain region of a switching device of a first memory cell and an RSE of an adjacent second memory cell. As discussed above, the type of bi-directional memory cell and configuration of each memory cell can present a hard direction for a read or write current. Decision step 306 then determines whether the direction of the current through a predetermined memory cell would be in the hard direction that could contribute to a higher voltage drop across the memory cell. If the predetermined memory cell would have current pass in the hard direction, step 308 further adjusts the voltage of the predetermined memory cell by passing an elevated voltage to the memory cell with a control line that extends along the corresponding row.

However, if the predetermined memory cell will not receive current in the hard direction, the data access routine 300 can write a resistive state to each selected memory cell with a bi-directional current in step 310. It should be noted that the hard direction as used herein describes a particular physical direction through the memory cell that provides greater resistance which corresponds to a smaller current flowing through the resistive sense element (RSE) for the a particular biased condition. Hence, writing a first selected state is more difficult as compared to that direction of the current required to set the RSE to a different, second selected state (the latter being referred to as the easy direction).

It should further be noted that the steps of the data access routine 300 are not limited. That is, the various steps can be omitted, moved, or modified without deterring from the spirit of the present invention. Similarly, the characterizations of a "hard direction" are not limited to a certain data access operation as step 308 can be performed during either read or write data access operations.

As can be appreciated by one skilled in the art, the various embodiments illustrated herein provide advantages in both data storage device efficiency and complexity due to the elimination of technically challenging manufacturing and functional operations. The reduction in number of overall control lines in a bidirectional memory array allows for more data capacity in combination with a reduced amount of processing requirements. Moreover, data access accuracy can be greatly improved by reducing the complexity associated with the various data read and write methods. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A memory array comprising:
a plurality of memory cells arranged into an M number of rows and an N number of columns with each memory cell comprising a resistive sense element (RSE) and a switching device;
a total number of M+N+1 control lines extending adjacent to and connected with the memory cells so that the switching devices of the memory cells along each row are connected to a respective one of said M control lines and the memory cells along each column are connected between a respective pair of said N+1 control lines; and
a control circuit which programs a selected memory cell by setting each of said N+1 control lines on one side of the selected memory cell along a selected row to a first voltage level and each of the remaining said N+1 control lines on an opposing second side of the selected memory cell along the selected row to a second voltage level different from the first voltage level.

2. The memory array of claim 1, wherein said N+1 control lines extend in a first direction through the plurality of memory cells, said M control lines extend in a second direction through the plurality of memory cells that is orthogonal to the first direction.

3. The memory array of claim 1, in which the control circuit further operates to apply a third voltage level to the selected one of said M control lines connected to the memory cells along the selected row and to apply a fourth voltage level different from the third voltage level to each of the remaining ones of said M control lines connected to the memory cells along the remaining non-selected rows.

4. The memory array of claim 1, in which the control circuit further operates to program a second memory cell along the selected row immediately adjacent the selected memory cell by toggling the voltage applied to the selected one of the N+1 control lines extending between and connected to the respective selected memory cell and the second selected memory cell.

5. The memory array of claim 1, in which each of the N+1 control lines extending between an adjacent pair of the memory cells along each row is directly connected to a switching device of a first one of said adjacent pair of the memory cells and is directly connected to an RSE of a remaining second one of said adjacent pair of the memory cells.

6. The memory array of claim 1, wherein the RSE of the selected memory cell is programmed to a first resistive state responsive to the first voltage being greater than the second voltage.

7. The memory array of claim 6, wherein the RSE of the selected memory cell is programmed to a second resistive state responsive to the second voltage being greater than the first voltage.

8. The memory array of claim 1, wherein the selected one of the M control lines connected to the memory cells along the selected row is provided with a third voltage level responsive to programming the selected memory cell in a hard direction, and the selected one of the M control lines connected to the memory cells along the selected row is provided with a fourth voltage level less than the third voltage level responsive to programming the selected memory cell in an easy direction.

9. The memory array of claim 1, wherein the RSE in each of the plurality of memory cells comprises a spin torque transfer random access memory (STRAM) cell.

10. The memory array of claim 1, wherein the RSE in each of the plurality of memory cells comprises a resistive random access memory (RRAM) cell.

11. The memory array of claim 1, wherein the RSE in each of the plurality of memory cells comprises a programmable metallization cell.

12. A method comprising:
providing a plurality of memory cells arranged into an M number of rows and an N number of columns with each memory cell comprising a resistive sense element (RSE) and a switching device;
connecting the memory cells with a total number of M+N+1 control lines extending adjacent to the memory cells so that the switching devices of the memory cells along each row are connected to a respective one of said M control lines and the memory cells along each column are connected between a respective pair of said N+1 control lines; and
writing a programmed state to a selected memory cell along a selected row by applying a first voltage level to each of said N+1 control lines on one side of the selected memory cell along the selected row and concurrently applying a second voltage level different from the first voltage level to each of the remaining N+1 control lines on an opposing other side of the selected memory cell along the selected row.

13. The method of claim 12, wherein a first resistive state is written to the selected memory cell by setting the first voltage level to be greater than the second voltage level, and a second resistive state is written to the selected memory cell by setting the first voltage level to be less than the second voltage level.

14. The method of claim 12, wherein the writing step further comprises applying a third voltage level to the selected one of said M control lines connected to the memory cells along the selected row and concurrently applying a fourth voltage level less than the third voltage level to each of the remaining ones of said M control lines connected to the memory cells along the remaining non-selected rows.

15. The method of claim 12, wherein the writing step further comprises programming a second selected memory cell along the selected row immediately adjacent the selected memory cell by toggling the voltage applied to the selected one of the N+1 control lines between the selected memory cell and the second selected memory cell between the first and second voltage levels.

16. A storage device comprising:
   a memory array comprising non-volatile memory cells arranged into M rows and N columns with the memory cells along each row connected to a selected one of M control lines extending in a first direction and the memory cells along each column connected between an adjacent pair of N+1 control lines extending in an orthogonal second direction; and
   a control circuit which programs a selected memory cell in the array by setting each of said N+1 control lines on one side of the selected memory cell along a selected row to a first voltage level and each of the remaining said N+1 control lines on an opposing second side of the selected memory cell along the selected row to a second voltage level different from the first voltage level.

17. The storage device of claim 16, in which each of the memory cells comprises a programmable resistive sense element (RSE) in series with a switching device, each of the M control lines is respectively connected to a gate region of the switching devices of the memory cells along each row, and the control circuit further operates to apply a third voltage level to the selected one of said M control lines connected to the memory cells along the selected row and to apply a fourth voltage level lower than the third voltage level to each of the remaining ones of said M control lines connected to the memory cells along the remaining non-selected rows.

18. The storage device of claim 16, in which the control circuit further operates to program a second memory cell along the selected row immediately adjacent the selected memory cell by toggling the selected one of the N+1 control lines extending between and connected to the respective selected memory cell and the second selected memory cell between the first voltage level and the second voltage level.

19. The storage device of claim 18, in which the control circuit further operates to program each of the memory cells along the selected row in turn by respectively toggling a selected one of the N+1 control lines in turn.

20. The storage device of claim 16, in which the RSE of the selected memory cell is programmed to a first resistive state responsive to the first voltage being greater than the second voltage, and the RSE of the selected memory cell is programmed to a second resistive state responsive to the second voltage being greater than the first voltage.

* * * * *